United States Patent
Bailey

(10) Patent No.: US 9,133,836 B2
(45) Date of Patent: Sep. 15, 2015

(54) VACUUM PUMPING SYSTEM

(75) Inventor: Christopher Mark Bailey, Horsham (GB)

(73) Assignee: Edwards Limited, Crawley (GB)

( * ) Notice: Subject to any disclaimer, the term of this patent is extended or adjusted under 35 U.S.C. 154(b) by 1198 days.

(21) Appl. No.: 12/226,083

(22) PCT Filed: Mar. 30, 2007

(86) PCT No.: PCT/GB2007/050174
§ 371 (c)(1),
(2), (4) Date: Apr. 27, 2009

(87) PCT Pub. No.: WO2007/119077
PCT Pub. Date: Oct. 25, 2007

(65) Prior Publication Data
US 2009/0208649 A1    Aug. 20, 2009

(30) Foreign Application Priority Data
Apr. 18, 2006 (GB) ................................ 0607616.0

(51) Int. Cl.
*C23C 16/455* (2006.01)
*C23C 16/54* (2006.01)
(Continued)

(52) U.S. Cl.
CPC ............. *F04B 41/06* (2013.01); *C23C 16/4412* (2013.01); *C23C 16/45525* (2013.01); *C23C 16/45544* (2013.01)

(58) Field of Classification Search
CPC ...................... H01L 21/3141; H01L 21/02636; C23C 16/45534; C23C 16/45525; C23C 16/4412; C23C 16/45544; C23C 16/455; F04B 41/06
USPC .......................... 427/248.1; 118/715, 724, 663
See application file for complete search history.

(56) References Cited

U.S. PATENT DOCUMENTS 7,635,502 B2 * 12/2009 Sneh .......................... 427/248.1
(Continued)

FOREIGN PATENT DOCUMENTS

EP     1 371 750 A1    12/2003
(Continued)

OTHER PUBLICATIONS

Suzuki Keita; English language abstract of JP 10312968 A; entitled "Method and Device for Exhaust Gas Switching," Sony Corp; Nov. 24, 1998.
(Continued)

*Primary Examiner* — Scott Kastler
*Assistant Examiner* — Michael Aboagye
(74) *Attorney, Agent, or Firm* — Shumaker & Sieffert, P.A.

(57) ABSTRACT

A vacuum pumping system comprises a primary foreline for receiving a gas stream from an outlet of a chamber, a first vacuum pump for evacuating the chamber, a second vacuum pump for evacuating the chamber, a first secondary foreline for conveying gas from the primary foreline to the first vacuum pump, a second secondary foreline for conveying gas from the primary foreline to the second vacuum pump, and valve means for selectively connecting a chosen one of the first and second secondary forelines to the primary foreline. The condition of the vacuum pumps is monitored during use. When both vacuum pumps are operating normally, the valve means is controlled to divert a first reactant-rich gas from the primary foreline into the first secondary foreline, and to divert a second reactant-rich gas from the primary foreline to the second secondary foreline, thereby inhibiting mixing of the first and second reactants within the vacuum pumps. However, in the event that the condition of one of the vacuum pumps indicates that one of the pumps is likely to fail during a current process within the chamber, the valve means is controlled to divert both the first reactant-rich gas and the second reactant-rich gas to the other vacuum pump, thereby preventing the potentially costly loss of a batch of substrates within the chamber.

5 Claims, 2 Drawing Sheets

(51) Int. Cl.
  *B05C 11/00* (2006.01)
  *F04B 41/06* (2006.01)
  *C23C 16/44* (2006.01)

(56) References Cited

U.S. PATENT DOCUMENTS

| | | | |
|---|---|---|---|
| 2002/0129768 A1* | 9/2002 | Carpenter et al. | 118/715 |
| 2004/0107897 A1* | 6/2004 | Lee et al. | 117/200 |
| 2005/0081786 A1* | 4/2005 | Kubista et al. | 118/715 |
| 2005/0221004 A1* | 10/2005 | Kilpela et al. | 427/248.1 |
| 2006/0073276 A1* | 4/2006 | Antonissen | 427/248.1 |
| 2008/0262655 A1* | 10/2008 | Smith et al. | 700/247 |

FOREIGN PATENT DOCUMENTS

| | | |
|---|---|---|
| JP | 10-312968 | 11/1998 |
| KR | 1020040049174 A | 6/2004 |
| WO | WO 2005/031032 A2 | 4/2005 |

OTHER PUBLICATIONS

United Kingdom Search Report of Application No. GB 0607616.0 dated Aug. 18, 2006; Claims searched: 1-19; Date of search: Aug. 17, 2006.
PCT Notification of Transmittal of the International Search Report and the Written Opinion of the International Searching Authority, or the Declaration of International Application No. PCT/GB2007/050174; Date of mailing Jan. 28, 2008.
PCT International Search Report of International Application No. PCT/GB2007/050174; Date of mailing of the International Search Report: Jan. 28, 2008.
PCT Written Opinion of the International Searching Authority of International Application No. PCT/GB2007/050174; Date of mailing: Jan. 28, 2008.
EP Communication Pursuant to Article 94(3) mailed Nov. 21, 2012 in corresponding EP Application No. 07733597.4-1215, 4 pgs.
English Translation of the Notice of Preliminary Rejection mailed Aug. 26, 2013 in corresponding Korean Patent Appln No. 2008-7025315, 3 pgs.
English Translation of the Office Action of the TW Intellectual Property Office mailed Mar. 19, 2013 in corresponding TW Application No. 096113682, 7 pgs.

* cited by examiner

VACUUM PUMPING SYSTEM

FIELD OF THE INVENTION

The present invention relates to a vacuum pumping system, and finds particular use in an apparatus used to draw gases from a process chamber in which a pulsed gas delivery system is used to supply gases to the process chamber.

BACKGROUND OF THE INVENTION

Pulsed gas delivery systems are commonly used in the formation of multi-layer thin films on a batch of substrates located in a process chamber. One such technique for forming thin films on substrates is atomic layer deposition (ALD), in which gaseous reactants, or "precursors", are sequentially delivered to a process chamber to form very thin layers, usually on an atomic-layer scale, of materials on the substrates.

By way of example, a high dielectric constant capacitor may be formed on a silicon wafer using an ALD technique through the sequential deposition of hafnium oxide ($HfO_2$) and aluminium oxide ($Al_2O_3$) thin films. $HfO_2$ thin films may be formed by the sequential supply of a hafnium precursor, such as tetrakis(ethylmethylamino)hafnium (TEMAH), and an oxidant, such as ozone ($O_3$), to the process chamber, and $Al_2O_3$ thin films may be formed by the sequential supply of an aluminium precursor, such as trimethyl aluminium (TMA), and $O_3$ to the chamber.

In overview, the first precursor delivered to the process chamber is adsorbed on to the surfaces of the substrates within the process chamber. The non-adsorbed first precursor is drawn from the process chamber by a vacuum pumping system, and the second precursor is then delivered to the process chamber for reaction with the first precursor to form a layer of deposited material. In the deposition chamber, the conditions immediate to the substrates are optimised to minimise gas-phase reactions and maximise surface reactions for the formation of a continuous film on each substrate. Any non-reacted second precursor and any by-products from the reaction between the precursors is then removed from the process chamber by the pumping system. Depending on the structure being formed within the process chamber, the first precursor, or a third precursor, is then delivered to the process chamber.

A purge step is typically carried out between the delivery of each precursor, for example by delivering a purge gas, such as $N_2$ or Ar, to the chamber between the delivery of each precursor. The purpose of the purge gas delivery is to remove any residual precursor from the process chamber so as to prevent unwanted reaction with the next precursor supplied to the chamber.

In practice, only around 5% or less of the precursors supplied to the process chamber are consumed during the deposition process, and so the gas drawn from the chamber during the process chamber will, between supplies of purge gas to the chamber, alternately be rich in the first precursor, and then rich in the second precursor.

In convention vacuum pumping systems, the gases drawn from the process chamber enter a common foreline leading to a vacuum pump. In the event that the non-reacted precursors meet within the vacuum pumping system, cross-reaction of the precursors can occur, and this can result in both the deposition of solid material and the accumulation of powders within the foreline and the vacuum pump. Particulates and powders that have accumulated within the pump can effectively fill the vacant running clearance between the rotor and stator elements of the pump, leading to a loss of pumping performance and ultimately pump failure. Periodic pump cleaning or replacement is then required to maintain pumping performance, resulting in costly process downtime and increasing manufacturing costs.

In order to avoid reaction between non-reacted precursors downstream from an ALD process chamber, US 2004/0107897 describes a vacuum pumping system in which the foreline from the process chamber branches into first and second exhaust lines each leading to a respective vacuum pump. A first exhaust control valve is installed within the first exhaust line, and a second exhaust control valve is installed within the second exhaust line. The opening and closing of the control valves is timed in relation to the supply of first and second precursors to the process chamber so that during a period in which the first precursor is being supplied to the process chamber, the second exhaust line is closed, and during a period in which the second precursor is being supplied to the process chamber, the first exhaust line is closed. This reduces the extent of the mixing of the non-reacted precursors within the exhaust lines and the vacuum pumps, increasing process uptime and throughput.

A problem associated with both the conventional vacuum pumping system and the vacuum pumping system described in US 2004/0107897 is that if the, or one of the, vacuum pumps fails during processing within the process chamber, the batch of substrates currently being processed within the chamber will be lost. In order to increase product throughput, the numbers of substrates being processed within a process chamber at any one time may be anywhere between 25 and 100 or more, and so failure of a vacuum pump during a deposition process may be very costly.

BRIEF SUMMARY OF THE INVENTION

It is an aim of the present invention to seek to solve this problem.

SUMMARY OF THE INVENTION

The present invention provides a vacuum pumping system for evacuating a chamber, the system comprising a first vacuum pump, a second vacuum pump, a first exhaust path along which gas is conveyed from the chamber to the first vacuum pump, a second exhaust path along which gas is conveyed from the chamber to the second vacuum pump, means for monitoring a condition of each vacuum pump, valve means for selectively opening and closing the first and second exhaust paths, and means for controlling the valve means to, depending on the condition of the vacuum pumps, either (i) alternately convey a first reactant-rich gas exhaust from the chamber along the first exhaust path, and a second reactant-rich gas exhaust from the chamber along the second exhaust path, or (ii) convey both the first reactant-rich gas and the second reactant-rich gas along a common exhaust path.

Features described above in relation to system and apparatus aspects of the invention are equally applicable to method aspects, and vice versa.

BRIEF DESCRIPTION OF THE SEVERAL VIEWS OF THE DRAWINGS

The present invention will now be described, by way of example only, with reference to the accompanying drawings, in which.

DETAILED DESCRIPTION OF THE INVENTION

Figure 1:
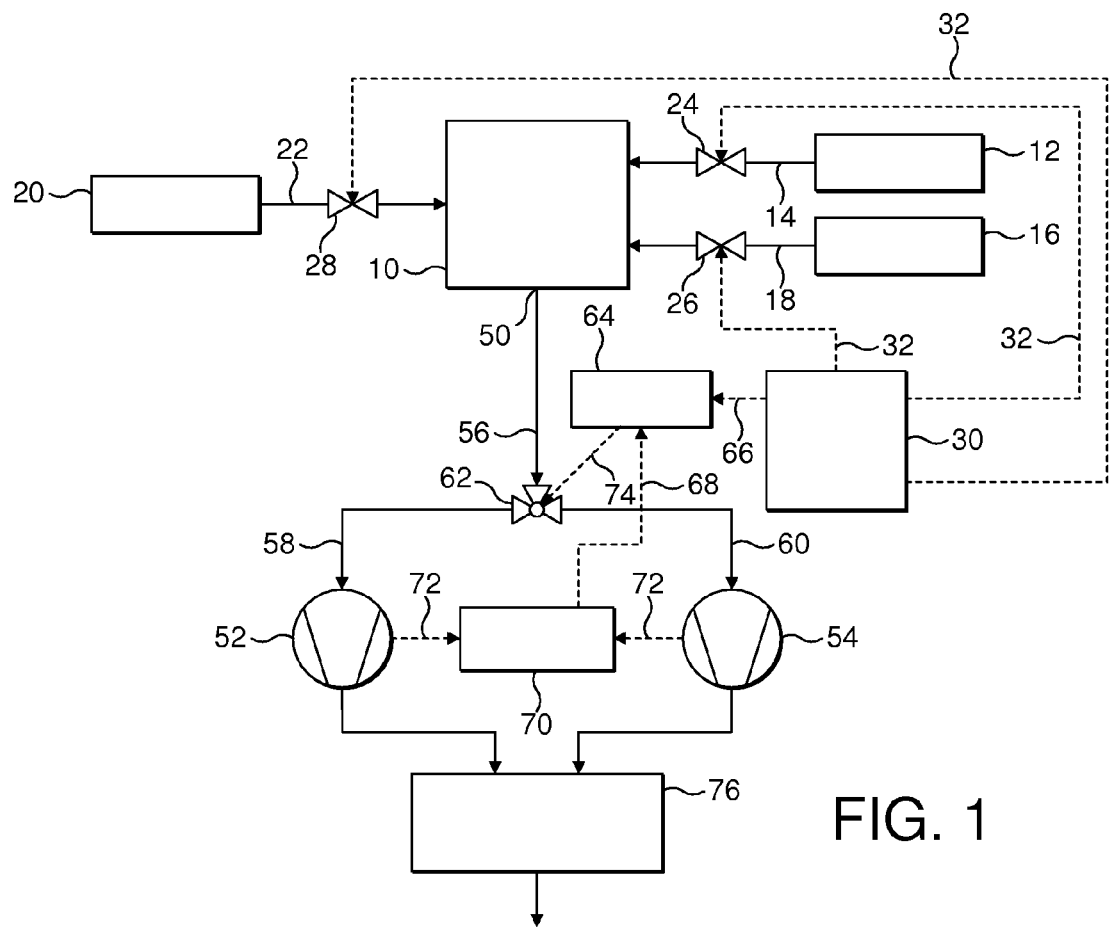
FIG. 1 illustrates schematically an atomic layer deposition apparatus.

The present invention provides a vacuum pumping system for evacuating a chamber, the system comprising a first vacuum pump, a second vacuum pump, a first exhaust path along which gas is conveyed from the chamber to the first vacuum pump, a second exhaust path along which gas is conveyed from the chamber to the second vacuum pump, means for monitoring a condition of each vacuum pump, valve means for selectively opening and closing the first and second exhaust paths, and means for controlling the valve means to, depending on the condition of the vacuum pumps, either(i) alternately convey a first reactant-rich gas exhaust from the chamber along the first exhaust path, and a second reactant-rich gas exhaust from the chamber along the second exhaust path, or (ii) convey both the first reactant-rich gas and the second reactant-rich gas along a common exhaust path.

In accordance with the invention, the condition of the vacuum pumps is monitored during use. When both vacuum pumps are operating normally, the valve means is controlled to alternately convey a first reactant-rich gas exhaust from the chamber along the first exhaust path, and a second reactant-rich gas exhaust from the chamber along the second exhaust path, thereby inhibiting mixing of the first and second reactants within the vacuum pumps and thus preventing any cross-reaction between the reactants which could lead to the undesirable formation of solid material within the pumps. The switching between the first and second exhaust paths may be made in response to one of a variation of the composition of gas to be supplied to the chamber, or a variation of the composition of gas exhausted from the chamber.

However, in the event that the condition of one of the vacuum pumps indicates that that pump is likely to fail during a current process within the chamber, the valve means may be controlled to convey both the first reactant-rich gas and the second reactant-rich gas to the other, "healthy" vacuum pump, isolating the "unhealthy" vacuum pump from the chamber so as to prevent the potentially costly loss of a batch of substrates within the chamber by maintaining the efficiency with which gas is removed from the chamber. Maintenance or replacement of one or both of the vacuum pumps can then be conducted following the completion of the processing of the current batch of substrates, or at any convenient time before the performance of the healthy pump begins to degrade due to the mixing and cross-reaction of the first and second reactants within the healthy pump.

The monitoring means may be configured to monitor any operating characteristic of the pumps which may be indicative of the degree of blocking of the pump. Depending on the monitored characteristic of one of the pumps, for example if the current drawn by that pump exceeds a predetermined amount, the valve means may be controlled to divert both the first reactant-rich gas and the second reactant-rich gas to the other pump. Other operating characteristics that may be monitored include, but are not limited to: motor power; pump temperature; exhaust pressure; bearing vibration; as variation in any of the above operating characteristics or any combination thereof could be used to indicate pump blockage.

The monitoring means may be provided by a single pump monitor for monitoring the condition of both of the first and second vacuum pumps. Alternatively, a first pump monitoring means may be provided for monitoring the condition of the first vacuum pump, and a second pump monitoring means provided to monitor the condition of the second vacuum pump, with the control means being configured to receive input from the first and second pump monitoring means. In this case, each pump monitoring means may be integrated into its respective vacuum pump.

The monitoring of the condition of each pump may be performed before, preferably immediately before, the supply to the chamber of the respective reactant to be drawn from the chamber by that pump. In the event that, for example, the monitored condition indicates that the condition of the first vacuum pump has deteriorated beyond a threshold condition, then the valve means may be controlled to isolate the first vacuum pump from the chamber so that the first reactant-rich gas is drawn from the chamber along the second exhaust path extending from the chamber to the second vacuum pump.

In another arrangement, the exhaust paths comprise a common foreline for receiving gas from the chamber, the first exhaust path comprising a first exhaust line extending between the foreline and the first vacuum pump, and the second exhaust path comprises a second exhaust line extending between the foreline and the second vacuum pump. The valve means may comprise a first exhaust control valve located in the first exhaust line, and a second exhaust control valve located in the second exhaust line. With this arrangement, opening the first exhaust control valve and closing the second exhaust control valve causes the gas exhaust from the chamber to be conveyed along the first exhaust line to the first vacuum pump, whereas opening the second exhaust control valve and closing the first exhaust control valve causes the gas exhaust from the chamber to be conveyed along the second exhaust line to the second vacuum pump. These valves may be provided by two separate gate valves or ball valves, each having one inlet and one outlet. Alternatively, in order to reduce the number of components of the vacuum pumping system, the valve means may comprise a valve located at a junction between the foreline and the two exhaust lines. Such a valve may be provided by a three way ball valve, a three way gate valve, or any other type of three way valve.

In the event that there are more than two different reactants supplied to the chamber, and where any two from three or more of those reactants could potentially react together in the vacuum system to form solid material or powders, then additional exhaust lines and vacuum pumps may be connected to the foreline as required to keep these reactants apart within the vacuum pumps. In this case, an additional two way valve may be located in each additional exhaust line, or a more complex, single valve, for example a four-way valve, may be provided at the iunction between the foreline and the exhaust lines.

The pumping system is particularly, but not exclusively, suitable for evacuating a chamber in which an atomic layer deposition process is conducted. In another arrangement, the present invention provides an atomic layer deposition apparatus comprising a process chamber, a first reactant supply for supplying a first reactant to the chamber, a second reactant supply for supplying a second reactant to the chamber, and a vacuum pumping system as aforementioned for drawing gas from the process chamber. A purge gas supply may be provided for supplying a purge gas such as nitrogen or argon to the chamber between the supply of the reactants thereto. In this arrangement, the control of the valve means to change the path along which gas exhausted from the chamber is conveyed to one of the vacuum pumps may be conducted during the supply of purge gas to the chamber.

The present invention also provides a method of evacuating a chamber to which a first reactant and a second reactant are alternately supplied, the method comprising the steps of alternately drawing a first reactant-rich gas from the chamber along a first exhaust path extending from the chamber using a first vacuum pump and a second reactant-rich gas from the chamber along a second exhaust path extending from the chamber using a second vacuum pump, monitoring a condition of each of the vacuum pumps during the evacuation of the chamber, and, depending on the monitored condition of one of the first and second vacuum pumps, subsequently drawing both the first reactant-rich gas and the second reactant-rich gas from the chamber using the other of the first and second vacuum pumps.

The present invention further provides a method of performing an atomic layer deposition, the method comprising the steps of locating a substrate within a process chamber, alternately supplying a first reactant and a second reactant to the chamber, alternately removing a first reactant-rich gas stream from the chamber along a first exhaust path using a first vacuum pump and a second reactant-rich gas stream from the chamber along a second exhaust path using a second vacuum pump, monitoring the condition of each of the vacuum pumps during the deposition process, and, depending on the monitored condition of one of the first and second vacuum pumps, subsequently removing both the first reactant-rich gas and the second reactant-rich gas from the chamber using the other of the first and second vacuum pumps.

With reference first to FIG. 1, an atomic layer deposition (ALD) apparatus comprises a process chamber 10 for receiving a batch of substrates to be processed simultaneously within the chamber 10. The chamber 10 receives separately and alternately two or more different reactants or precursors for use in forming layers of material on the exposed surfaces of the substrates. In the example illustrated in FIG. 1, a first reactant supply 12 is connected to the chamber 10 by a first reactant supply line 14 for supplying a first reactant to the chamber 10, and a second reactant supply 16 is connected to the chamber 10 by a second reactant supply line 18 for supplying a second reactant to the chamber 10. A purge gas supply 20 is also connected to the chamber 10 by a purge gas supply line 22 for supplying a purge gas such as nitrogen or argon to the chamber 10 between the supply of the reactants to the chamber 10.

Figure 2:
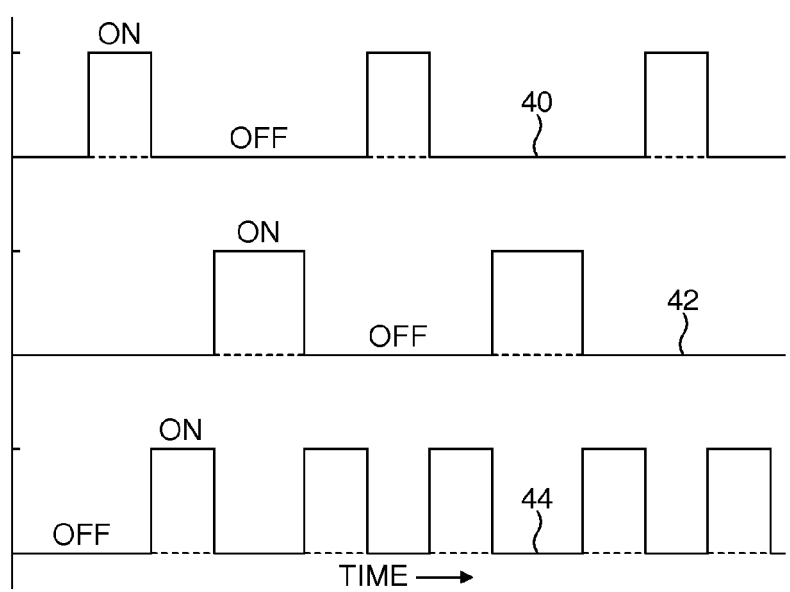
FIG. 2 illustrates the sequence of supply of gases to the process chamber of the apparatus of FIG. 1.

The supply of the reactants and the purge gas to the chamber 10 is controlled by the opening and closing of gas supply valves 24, 26, 28 located in the supply lines 14, 18, 22 respectively. The operation of the gas supply valves is controlled by a supply valve controller 30 which issues control signals 32 to the gas supply valves to open and close the valves according to a predetermined gas delivery sequence. A typical gas delivery sequence involving two reactant gases and a purge gas is illustrated in FIG. 2. The first trace 40 represents the stepped delivery sequence for the first reactant gas, and the second trace 42 represents the stepped delivery sequence for the second reactant gas. As described above, the first and second reactants are alternately supplied to the chamber to form layers of material on the batches of substrates located within the chamber 10. The duration of each pulsed delivery of reactant to the chamber 10 is defined for the particular process to be performed within the chamber 10; in this example, the duration of each pulsed delivery of the second reactant to the chamber 10 is longer than that for the first reactant. The third trace 44 represents the stepped delivery sequence for the purge gas that is introduced into the chamber 10 between the delivery of first and second reactant gases to flush the chamber 10 before introducing the next reactant gas.

In view of the alternating supply of first and second reactants to the chamber 10, the gas drawn from the chamber 10 will alternate between a first reactant-rich gas, comprising non-reacted first reactant and by-products from the reaction between the reactants, and a second reactant-rich gas, comprising non-reacted second reactant and the by-products, with a purge gas-rich gas being drawn from the chamber 10 between these reactant-rich gases. Each of the reactant-rich gases is also likely to contain traces of purge gas, the other reactant, and other contaminants.

Returning to FIG. 1, a vacuum pumping system is connected to the outlet 50 of the chamber 10 for drawing gas from the chamber 10. The pumping system comprises first and second vacuum pumps 52, 54 each for drawing a gas exhausted from the chamber 10 along a respective exhaust path. In this embodiment, the vacuum pumping system comprises a foreline 56 extending from the outlet 50 of the chamber 10, and first and second exhaust lines 58, 60 each extending from the foreline to a respective vacuum pump 52, 54. The first exhaust path is defined by the foreline 56 and the first exhaust line 58, and the second exhaust path is defined by the foreline 56 and the second exhaust line 60. Gas exhausted from the vacuum pumps 52, 54 is conveyed to an abatement device 76 for treating the gas before it is vent to the atmosphere.

The pumping system is provided with valve means for selectively opening and closing the first and second exhaust paths so that the gas drawn from the chamber 10 is conveyed to a selected one of the vacuum pumps 52, 54. In the illustrated embodiment, the valve means is provided by a three-way valve 62 located at the junction between the foreline 56 and the exhaust lines 58, 60. The valve 62 is moveable between a first position in which the gas drawn from the chamber 10 passes along the first exhaust path 56, 58 to the first vacuum pump 52, and a second position in which the gas drawn from the chamber 10 passes along the second exhaust path 56, 60 to the second vacuum pump 54.

Movement of the valve 62 is controlled by an exhaust valve controller 64. The exhaust valve controller 64 may be, as illustrated, separate from the supply valve controller 30, or it may be integral with that controller 30. In the illustrated arrangement, the exhaust valve controller 64 receives signals 66 from the supply valve controller 30 which are indicative of the operating sequence of the valves 24, 26, 28, and thereby indicative of the nature of the gas that is currently being delivered to, and/or just about to be delivered to, the chamber 10.

The exhaust valve controller 64 also receives signals 68 from a pump monitoring system 70 that monitors the condition of the vacuum pumps 52, 54. As illustrated, the monitoring system 70 may be separate from the vacuum pumps 52, 54, and configured to receive signals 72 from the pump controllers (not illustrated) of the vacuum pumps 52, 54 which are indicative of the condition of the vacuum pumps 52, 54. Alternatively, a monitoring system for each pump may be integrated into the pump controller, with the pump controller issuing the signals 72 indicative of the condition of its pump to the exhaust valve controller 64. As another alternative, the monitoring system 70 may be integral with the exhaust valve controller 64.

The signals 72 output from the pump controllers may include information relating to one or more of a number of operating characteristics of the pumps. These characteristics include, but are not limited to: current drawn by the motor of the pump; motor power; pump temperature; exhaust pressure; and bearing vibration; as variation in any of the above operating characteristics or any combination thereof could be used to indicate pump blockage. Depending on the information received in the signals 72, the monitoring system 70 can (i) determine whether the condition of the vacuum pumps 52, 54 has fallen to or below a threshold value, below which, for example, the future operational life of the pump may be shorter than the duration of the process being conducted within the chamber 10, and/or (ii) predict a time scale within which the condition of the pump is likely to fall below this threshold. The signals 68 output from the monitoring system 70 to the exhaust valve controller 64 may therefore indicate, for each pump 52, 54, whether the condition of the pump is above or below this threshold value. These signals may be output continuously, periodically, or upon demand from the exhaust valve controller 64.

Figure 3:
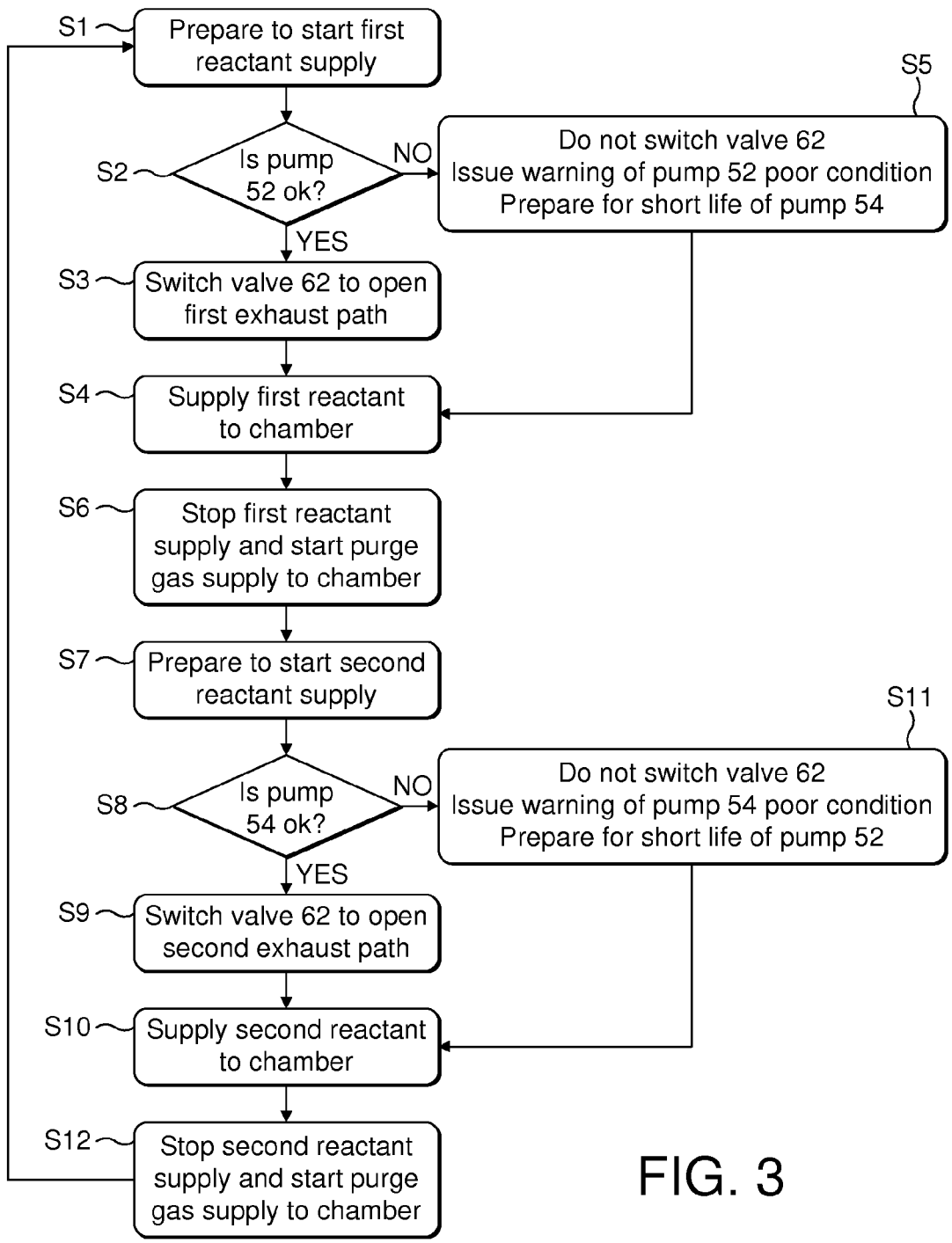
FIG. 3 is a flow diagram illustrating a sequence of steps performed during the evacuation of the process chamber.

The exhaust valve controller 64 utilises the information contained within the signals 66, 68 to control the switching between the first and second positions of the valve 62 during the supply of gas to the chamber, and therefore control the path taken by the gas being drawn from the chamber 10. FIG. 3 is a flow diagram illustrating one example of a sequence of steps that are performed during the processing of a batch of substrates within the chamber 10. At step S1, the supply valve controller 30 indicates to the exhaust valve controller 64 that the first reactant is about to be delivered to the chamber 10. At step S2, the exhaust valve controller 64 determines from signal 68 whether the first vacuum pump 52 is "healthy", that is, whether the condition of the first vacuum pump 52 is above the threshold level.

If the first vacuum pump 52 is determined to be healthy, then, at step S3, then exhaust valve controller 64 outputs a signal 74 (illustrated in FIG. 1) to the valve 62 to switch to the first position before the first reactant is supplied to the chamber in step S4, so that during the supply of the first reactant to the chamber 10 a first-reactant rich gas drawn from the chamber 10 passes along the first exhaust path 56, 58 to the first vacuum pump 52.

On the other hand, if at step S2 the first vacuum pump 52 is determined to be "unhealthy", that is, the condition of the first vacuum pump 52 is at or below the threshold level, then, at step S5 the exhaust valve controller 64 outputs a signal 74 to the valve 62 to switch to the second position before the first reactant is supplied to the chamber in step S4, so that during the supply of the first reactant to the chamber 10 the first-reactant rich gas drawn from the chamber 10 passes along the second exhaust path 56, 60 to the second vacuum pump 54.

Following the supply of the first reactant to the chamber 10, and as illustrated in FIG. 2, at step S6 the purge gas is supplied to the chamber 10 to flush the chamber of non-reacted first reactant. During the supply of the purge gas to the chamber 10, at step S7, the supply valve controller 30 indicates to the exhaust valve controller 64 that the second reactant is about to be delivered to the chamber 10. At step S8, the exhaust valve controller 64 determines from signal 68 whether the second vacuum pump 54 is "healthy".

If the second vacuum pump 54 is determined to be healthy, then, at step S9, then exhaust valve controller 64 outputs a signal 74 to the valve 62 to switch to the second position before the second reactant is supplied to the chamber in step S10, so that during the supply of the second reactant to the chamber 10 a second-reactant rich gas drawn from the chamber 10 passes along the second exhaust path 56, 60 to the second vacuum pump 54.

On the other hand, if at step S8 the second vacuum pump 54 is determined to be "unhealthy", then, at step S11, the exhaust valve controller 64 outputs a signal 74 to the valve 62 to switch to the first position before the second reactant is supplied to the chamber in step S10, so that during the supply of the second reactant to the chamber 10 the second-reactant rich gas drawn from the chamber 10 passes along the first exhaust path 56, 58 to the first vacuum pump 52.

Following the supply of the second reactant to the chamber 10, and as also illustrated in FIG. 2, at step S12 the purge gas is again supplied to the chamber 10 to flush the chamber of non-reacted second reactant. During the supply of the purge gas to the chamber 10, the sequence returns to step S1, and the steps S1 to S12 are repeated until either the processing within the chamber has been completed, or until both vacuum pumps are determined to be unhealthy.

In view of the above, while both of the vacuum pumps 52, 54 are healthy the valve 62 is controlled to alternately convey the first reactant-rich gas along the first exhaust path 56, 58, and the second reactant-rich gas along the second exhaust path 56, 60, thereby inhibiting mixing of the first and second reactants within the vacuum pumps 52, 54 and thus preventing any cross-reaction between the reactants which could lead to the undesirable formation of solid material within the pumps 52, 54.

However, in the event that the condition of one of the vacuum pumps 52, 54 indicates that that pump is likely to fail during a current process within the chamber, the valve 62 is controlled to convey both the first reactant-rich gas and the second reactant-rich gas to the other, healthy vacuum pump, isolating the unhealthy vacuum pump from the chamber 10 and thereby preventing the potentially costly loss of a batch of substrates within the chamber. As this can accelerate the degradation of the healthy pump, due to the mixing and cross-reaction of the first and second reactants within that pump, an alert or other indicator can be provided to an operator of the deposition system to conduct maintenance and/or replacement (as required) of one or both of the vacuum pumps 52, 54. The required maintenance and/or replacement can then be conducted following the completion of the processing of the current batch of substrates with the chamber 10, or at any convenient time before the performance of the healthy pump begins to degrade.

While the foregoing description and drawings represent various embodiments of the present invention, it will be apparent to those skilled in the art that various changes and modifications may be made therein without departing from the true spirit and scope of the present invention.

I claim:

1. A method of evacuating a chamber to which a first reactant and a second reactant are alternately supplied, the method comprising:

alternately drawing a first reactant-rich gas from the chamber along a first exhaust path extending from the chamber using a first vacuum pump and a second reactant-rich gas from the chamber along a second exhaust path extending from the chamber using a second vacuum pump during processing of a batch of substrates within the chamber;

monitoring an operating characteristic of each of the vacuum pumps during the evacuation of the chamber to determine a likelihood of failure of the respective vacuum pump, wherein the operating characteristic comprises at least one of current drawn by a motor of the pump, motor power, pump temperature, the pressure of gas exhaust from the pump, and vibration of a bearing of the pump; and in response to determining that the monitored operating characteristic of one of the first and second vacuum pumps indicates that the one of the first and second vacuum pumps is likely to fail during a current process in the chamber, subsequently drawing both the first reactant-rich gas and the second reactant-rich gas from the chamber using the other of the first and second vacuum pumps to allow completion of processing of the batch of substrates within the chamber, wherein the first reactant-rich gas and the second reactant-rich gas mix within the other of the first and second vacuum pumps, wherein the operating characteristic of the first vacuum pump is monitored before the first reactant is supplied to the chamber, and the operating characteristic of the second vacuum pump is monitored before the second reactant is supplied to the chamber.

2. A method of performing an atomic layer deposition, the method comprising the steps of:
locating a substrate within a process chamber;
alternately supplying a first reactant and a second reactant to the chamber during processing of the substrate within the chamber;
alternately removing a first reactant-rich gas stream from the chamber along a first exhaust path using a first vacuum pump and a second reactant-rich gas stream from the chamber along a second exhaust path using a second vacuum pump;
monitoring an operating characteristic of each of the vacuum pumps during the deposition process to determine a likelihood of failure of the respective vacuum pump, wherein the operating characteristic comprises at least one of current drawn by a motor of the pump, motor power, pump temperature, the pressure of gas exhaust from the pump, and vibration of a bearing of the pump; and
in response to determining that the monitored operating characteristic of one of the first and second vacuum pumps indicates that the one of the first and second vacuum pumps is likely to fail during a current process in the chamber, subsequently removing both the first reactant-rich gas and the second reactant-rich gas from the chamber using the other of the first and second vacuum pumps to allow completion of processing of the substrate within the chamber, wherein the first reactant-rich gas and the second reactant-rich gas mix within the other of the first and second vacuum pumps, wherein the operating characteristic of the first vacuum pump is monitored before the first reactant is supplied to the chamber, and the operating characteristic of the second vacuum pump is monitored before the second reactant is supplied to the chamber.

3. The method of claim 2, further comprising supplying a purge gas to the chamber between supplying the first reactant to the chamber and supplying the second reactant to the chamber.

4. The method of claim 1, wherein the operating characteristic comprises at least one of the current drawn by the motor of the pump, the motor power, the pump temperature, and the vibration of the bearing of the pump.

5. The method of claim 2, wherein the operating characteristic comprises at least one of the current drawn by the motor of the pump, the motor power, the pump temperature, and the vibration of the bearing of the pump.

* * * * *